US011120985B2

(12) United States Patent
Kodama

(10) Patent No.: US 11,120,985 B2
(45) Date of Patent: Sep. 14, 2021

(54) SUBSTRATE TRANSFER DEVICE, SUBSTRATE PROCESSING SYSTEM, SUBSTRATE PROCESSING METHOD AND COMPUTER-READABLE RECORDING MEDIUM

(71) Applicant: TOKYO ELECTRON LIMITED, Tokyo (JP)

(72) Inventor: Munehisa Kodama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/765,902

(22) PCT Filed: Nov. 9, 2018

(86) PCT No.: PCT/JP2018/041637
§ 371 (c)(1),
(2) Date: May 21, 2020

(87) PCT Pub. No.: WO2019/102868
PCT Pub. Date: May 31, 2019

(65) Prior Publication Data
US 2020/0306925 A1  Oct. 1, 2020

(30) Foreign Application Priority Data

Nov. 22, 2017  (JP) .............................. JP2017-224672

(51) Int. Cl.
*H01L 21/683* (2006.01)
*H01L 21/02* (2006.01)
*B24B 37/27* (2012.01)

(52) U.S. Cl.
CPC ........ *H01L 21/02057* (2013.01); *B24B 37/27* (2013.01); *H01L 21/6838* (2013.01)

(58) Field of Classification Search
CPC ..... B24B 37/345; B24B 37/27; B24B 53/017; H01L 21/02057; Y10S 901/45; Y10S 901/40; B25J 19/0091
See application file for complete search history.

(56) References Cited

U.S. PATENT DOCUMENTS 4,299,529 A * 11/1981 Inaba ....................... B25J 9/101
414/590
4,561,176 A * 12/1985 Leddet .................... B23P 19/10
29/709

(Continued)

FOREIGN PATENT DOCUMENTS

JP   S58067685 U   5/1983
JP   S62102985 A   5/1987

(Continued)

OTHER PUBLICATIONS

International Search Report of PCT/JP2018/041637 dated Feb. 5, 2019.

*Primary Examiner* — Gregory W Adams
(74) *Attorney, Agent, or Firm* — Brundidge & Stanger, P.C.

(57) ABSTRACT

A substrate transfer device configured to transfer a substrate while holding a first surface of the substrate by a substrate holder and configured to deliver a second surface of the substrate is provided. The substrate transfer device includes a tilting mechanism configured to perform tilting of the substrate holder when viewed from a side; and a fixing mechanism configured to stop the tilting of the substrate holder when viewed from the side.

7 Claims, 19 Drawing Sheets

(56) References Cited

U.S. PATENT DOCUMENTS

| | | | | |
|---|---|---|---|---|
| 4,684,113 A * | 8/1987 | Douglas | ............... | B23Q 1/035 |
| | | | | 269/21 |
| 5,457,868 A * | 10/1995 | Blaimschein | ......... | B23Q 1/035 |
| | | | | 269/21 |
| 6,168,220 B1 * | 1/2001 | Schmalz | ............. | B25J 15/0616 |
| | | | | 294/186 |
| 6,189,876 B1 * | 2/2001 | Frazier | ............... | B25B 11/005 |
| | | | | 269/21 |
| 6,285,152 B1 * | 9/2001 | Ookura | ................... | B25J 9/042 |
| | | | | 318/568.11 |
| 7,022,000 B2 * | 4/2006 | Mizomoto | ............. | B24B 7/228 |
| | | | | 451/288 |
| 7,195,535 B1 * | 3/2007 | Swedek | ............... | B24B 37/345 |
| | | | | 451/288 |
| 7,975,998 B2 * | 7/2011 | Keith | .................. | B23Q 1/0072 |
| | | | | 269/309 |
| 8,113,560 B2 * | 2/2012 | Sone | ................. | H05K 13/0409 |
| | | | | 294/183 |
| 8,291,566 B2 * | 10/2012 | Ushio | ....................... | B25J 5/02 |
| | | | | 29/407.08 |
| 8,657,648 B2 * | 2/2014 | Yamanaka | ............. | B24B 7/228 |
| | | | | 451/11 |

FOREIGN PATENT DOCUMENTS

| | | | |
|---|---|---|---|
| JP | H10284448 A | | 10/1998 |
| JP | 2010058213 A | * | 3/2010 |
| JP | 2014008597 A | | 1/2014 |
| JP | 2016107351 A | * | 6/2016 |
| JP | 2017005070 A | | 1/2017 |

* cited by examiner (b)

SUBSTRATE TRANSFER DEVICE, SUBSTRATE PROCESSING SYSTEM, SUBSTRATE PROCESSING METHOD AND COMPUTER-READABLE RECORDING MEDIUM

CROSS-REFERENCE TO RELATED APPLICATION

This PCT application claims the benefit of priority to Japanese Patent Application No. 2017-224672 filed on Nov. 22, 2017 and incorporated herein by reference in its entirety.

TECHNICAL FIELD

The various embodiments described herein pertain generally to a substrate transfer device that transfers a substrate while holding one surface thereof with a substrate holder and delivers the other surface of the substrate, a substrate processing system including the substrate transfer device, a substrate processing method using the substrate processing system, and a computer-readable recording medium.

BACKGROUND ART

Recently, in a manufacturing process of a semiconductor device, a semiconductor wafer (hereinafter, referred to as "wafer") having devices such as a plurality of electronic circuits on a front surface thereof has been thinned by grinding a rear surface thereof.

A rear surface of a wafer is ground using, for example, a grinding apparatus described in Patent Document 1. The grinding apparatus is equipped with a grinding unit for grinding the rear surface of the wafer, a positioning mechanism (alignment mechanism) for positioning the center position of the wafer before the grinding, and a cleaning mechanism for cleaning the wafer after the grinding. The grinding unit grinds the wafer held on a chuck of a rotary table and extends from the outside to an upper part of the rotary table when viewed from the top. Each of the positioning mechanism and the cleaning mechanism is placed outside the rotary table when viewed from the top.

The grinding apparatus is also equipped with a wafer supply mechanism that transfers wafers from the positioning mechanism to the chuck of the rotary table and a wafer recovery mechanism (transfer unit) that transfers the wafers from the chuck of the rotary table to the cleaning mechanism.

The wafer recovery mechanism includes a transfer pad that attracts and holds the wafer and a pivotable arm that supports the transfer pad. A buffer spring is provided between the transfer pad and the pivotable arm and applies a force on the transfer pad with respect to the pivotable arm in a separating direction to reduce the impact applied to the wafer from the transfer pad. In this way, the transfer pad is supported to be movable upward relative to the pivotable arm so as to avoid application of a strong pressing force on the wafer.

PRIOR ART DOCUMENT

Patent Document 1: Japanese Patent Laid-open Publication No. 2014-008597

DISCLOSURE OF THE INVENTION

Problems to be Solved by the Invention

Means for Solving the Problems

In one exemplary embodiment, there is provided a substrate transfer device configured to transfer a substrate while holding a first surface of the substrate by a substrate holder and configured to deliver a second surface of the substrate. The substrate transfer device includes a tilting mechanism configured to perform tilting of the substrate holder when viewed from a side; and a fixing mechanism configured to stop the tilting of the substrate holder when viewed from the side.

According to one aspect of the present disclosure, a substrate transfer device is equipped with a tilting mechanism and a fixing mechanism. Thus, for example, when a substrate is delivered, a substrate holder is allowed to be tilted by the tilting mechanism. Also, for example, while the substrate is transferred, the substrate holder can be fixed by the fixing mechanism. Therefore, it is possible to appropriately deliver and transfer a substrate to a plurality of devices.

In another exemplary embodiment, there is provided a substrate processing system configured to process a substrate. The substrate processing system includes a first holder configured to hold the substrate; a processor configured to process a processing surface of the substrate held on the first holder; a cleaning device configured to clean a non-processing surface of the substrate which is opposite to the processing surface of the substrate, the substrate being processed by the processor and held on a second holder, or configured to clean the second holder; and a transfer device, including the second holder, configured to transfer the substrate while holding the substrate by the second holder and configured to transfer the substrate to the cleaning device and a delivery position where the substrate is delivered to the first holder. The transfer device further includes: a tilting mechanism configured to perform tilting of the second holder when viewed from a side; and a fixing mechanism configured to stop the tilting of the second holder when viewed from the side.

In yet another exemplary embodiment, a substrate processing method of processing a substrate includes transferring the substrate to a first holder by a transfer device; processing a processing surface of the substrate held on the first holder by a processor; transferring the substrate to a cleaning device by the transfer device; and cleaning, by the cleaning device, a non-processing surface of the substrate which is opposite to the processing surface of the substrate held on a second holder of the transfer device or cleaning the second holder. The transfer device includes: a tilting mechanism configured to perform tilting of the second holder when viewed from a side; and a fixing mechanism configured to stop the tilting of the second holder when viewed from the side. When the transfer device delivers the substrate to the first holder in the transferring of the substrate to the first holder, the second holder is allowed to be tilted by the tilting mechanism, and in the cleaning of the non-processing surface or the cleaning of the second holder, when the non-processing surface of the substrate or the second holder is cleaned, the second holder is fixed by the fixing mechanism.

In still yet another exemplary embodiment, there is provided a computer-readable recording medium having stored thereon computer-executable instructions that, in response to execution, cause a substrate processing system to perform a substrate processing method.

DETAILED DESCRIPTION

Figure 1:
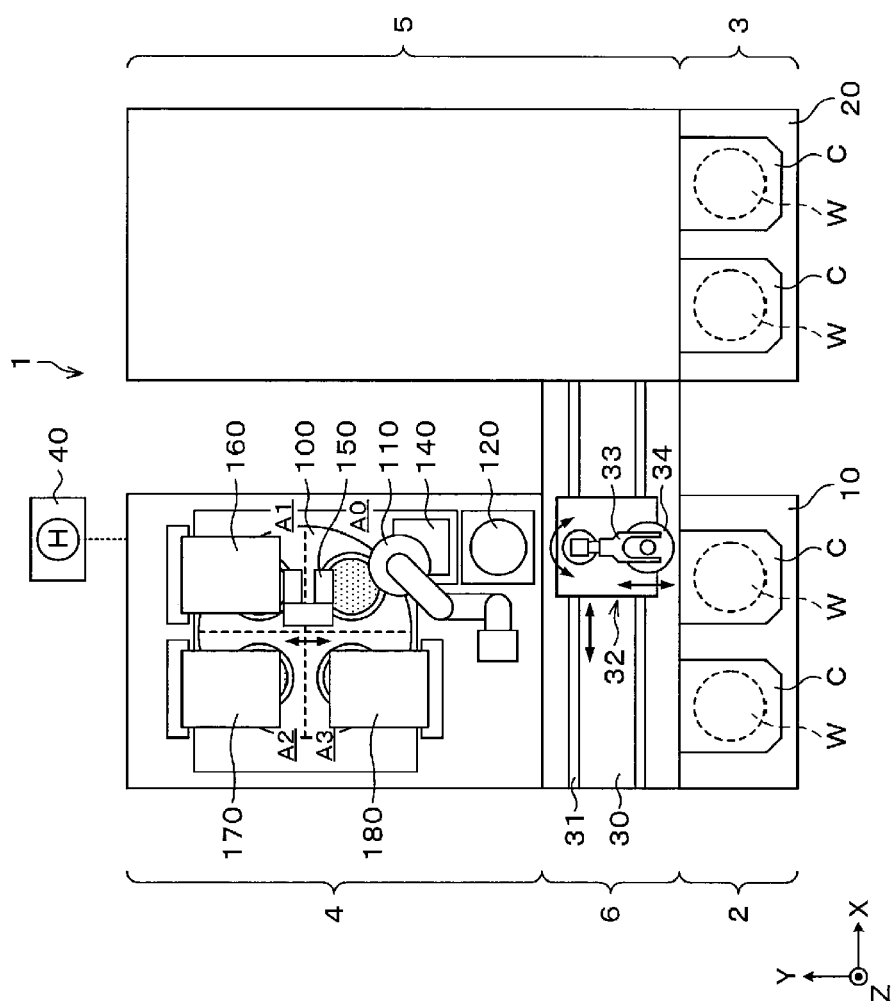
FIG. 1 is a plan view schematically illustrating a configuration of a substrate processing system according to an exemplary embodiment.

Hereinafter, exemplary embodiments of the present disclosure will be described with reference to the drawings. Further, in the present specification and the drawings, substantially the same components will be denoted by the same reference numerals, and redundant descriptions thereof will be omitted.

First, a configuration of a substrate processing system according to an exemplary embodiment will be described. FIG. 1 is a plan view schematically illustrating a configuration of a substrate processing system 1. Further, in the following, in order to clarify positional relationships, the X-axis, Y-axis and Z-axis directions which are orthogonal to each other will be defined, and the positive Z-axis direction will be regarded as a vertically upward direction.

In the substrate processing system 1 according to the present exemplary embodiment, a wafer W as a substrate is thinned. The wafer W is a semiconductor wafer such as a silicon wafer or a compound semiconductor wafer. A device (not shown) is formed on a front surface of the wafer W (hereinafter, referred to as "non-processing surface") and a protective member, such as a protective tape (not shown), for protecting the device is attached to the front surface. Also, the wafer is thinned by performing a predetermined process such as grinding on a rear surface of the wafer W (hereinafter, referred to as "processing surface").

The substrate processing system 1 includes a carry-in station 2 configured to accommodate a non-processed wafer W in a cassette C and carry a plurality of wafers W in a cassette into the substrate processing system 1 from the outside; a carry-out station 3 configured to accommodate a processed wafer W in a cassette C and carry a plurality of wafers W in a cassette out of the substrate processing system 1 to the outside; a processing device 4 configured to thin a wafer W by performing a processing on the wafer W; an post-processing device 5 configured to perform an post-processing on the processed wafer W; and a transfer station 6 connected to the carry-in station 2, the processing device 4 and the post-processing device 5 and configured to transfer a wafer W among the carry-in station 2, the processing device 4 and the post-processing device 5. The carry-in station 2, the transfer station 6 and the processing device 4 are sequentially arranged at the negative X-axis direction side in parallel with each other in the Y-axis direction. The carry-out station 3 and the post-processing device 5 are sequentially arranged at the positive X-axis direction side in parallel with each other in the Y-axis direction.

A cassette placing table 10 is provided in the carry-in station 2. In the illustrated example, a plurality of, e.g., two, cassettes C can be placed in a row in the X-axis direction on the cassette placing table 10. That is, the cassette placing table 10 is configured to hold a plurality of wafers W.

The carry-out station 3 has the same configuration as the carry-in station 2. A cassette placing table 20 is provided in the carry-out station 3, and, for example, two cassettes C can be placed in a row in the X-axis direction on the cassette placing table 20. That is, the cassette placing table 20 is configured to hold a plurality of wafers W. Otherwise, the carry-in station 2 and the carry-out station 3 may be integrated into a single carry-in/out station. In this case, a common cassette placing table is provided in the carry-in/out station.

In the processing device 4, processings such as grinding and cleaning are performed on the wafer W. The configuration of the processing device 4 will be described later.

In the post-processing device 5, a post-processing is performed on the wafer W which has been processed in the processing device 4. The post-processing may include, for example, a mounting processing of holding the wafer W on a dicing frame via a dicing tape and a peeling processing of peeling the protective tape attached to the wafer W. Further, the post-processing device 5 transfers the wafer W which has undergone the post-processing and has been held on the dicing frame to the cassette C of the carry-out station 3. The mounting processing and the peeling processing are performed in the post-processing device 5 using the known devices, respectively.

A wafer transfer section 30 is provided in the transfer station 6. The wafer transfer section 30 is equipped with a wafer transfer device 32 which is movable on a transfer path 31 extending in the X-axis direction. The wafer transfer device 32 serves as a wafer holder configured to hold the wafer W, and has a transfer fork 33 and a transfer pad 34. Each of the transfer fork 33 and the transfer pad 34 is configured to be movable in a horizontal direction and a vertical direction and pivotable around a horizontal axis and a vertical axis.

Figure 2:
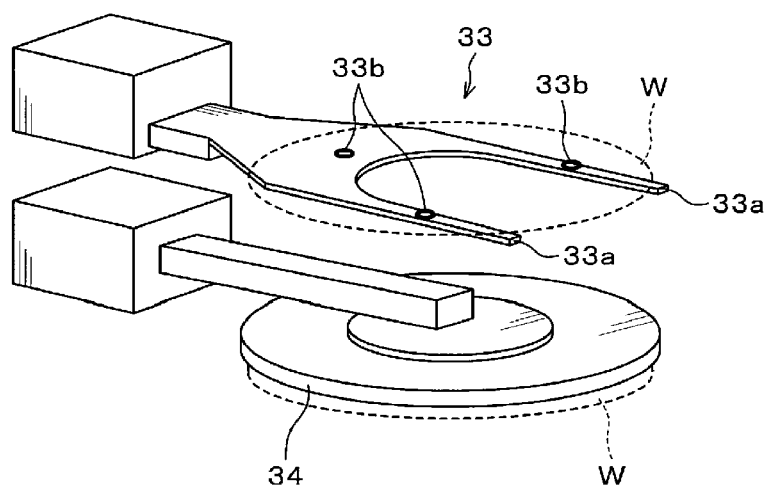
FIG. 2 is a perspective view schematically illustrating a configuration of a transfer fork and a transfer pad of a wafer transfer device.

As illustrated in FIG. 2, a tip end of the transfer fork 33 is branched into two tip end portions 33a. Also, for example, three pads 33b are provided on a front surface of the transfer fork 33. The pads 33b are connected to a suction mechanism (not illustrated) configured to perform evacuation to suction the wafer W. Thus, the transfer fork 33 attracts and holds the wafer W using the pads 33b. Further, the transfer fork 33 transfers the wafer W which has not yet been ground.

The transfer pad 34 has a circular shape having a greater diameter than the wafer W when viewed from the top. Also, the transfer pad 34 includes a plurality of suction openings (not illustrated) at a bottom surface thereof, and the suction openings are connected to a suction mechanism (not illustrated) configured to perform evacuation. Thus, the transfer pad 34 attracts and holds the entire processing surface of the wafer W. Further, the transfer pad 34 transfers the wafer W which has been ground, i.e., thinned.

As illustrated in FIG. 1, the substrate processing system 1 is equipped with a controller 40. The controller 40 is, for example, a computer and has a program storage (not illustrated). The program storage stores a program which controls the processing of the wafer W in the substrate processing system 1. The program storage also stores a program that controls operations of a driving system, such as the above-described various processing devices and transfer devices, to implement the following wafer processing in the substrate processing system 1. Also, the program may be stored in a computer-readable storage medium H such as a computer-readable hard disk (HD), flexible disk (FD), compact disk (CD), magneto-optical disk (MO) or memory card and installed from the storage medium H into the controller 40.

Figure 3:
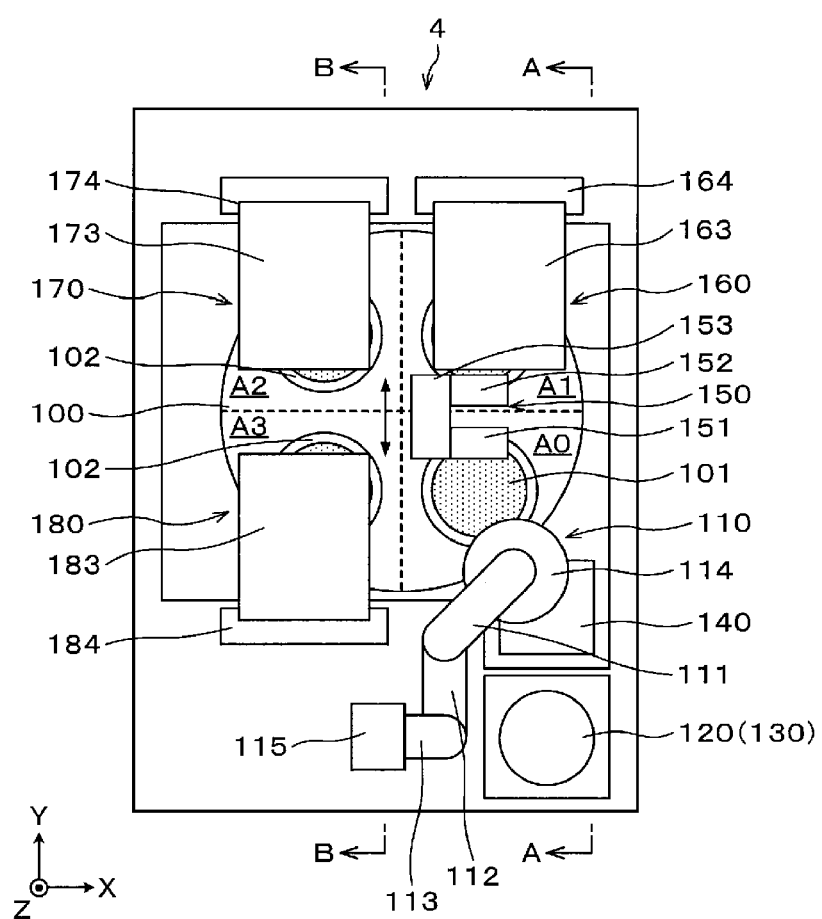
FIG. 3 is a plan view schematically illustrating a configuration of a processing device.
Figure 4:
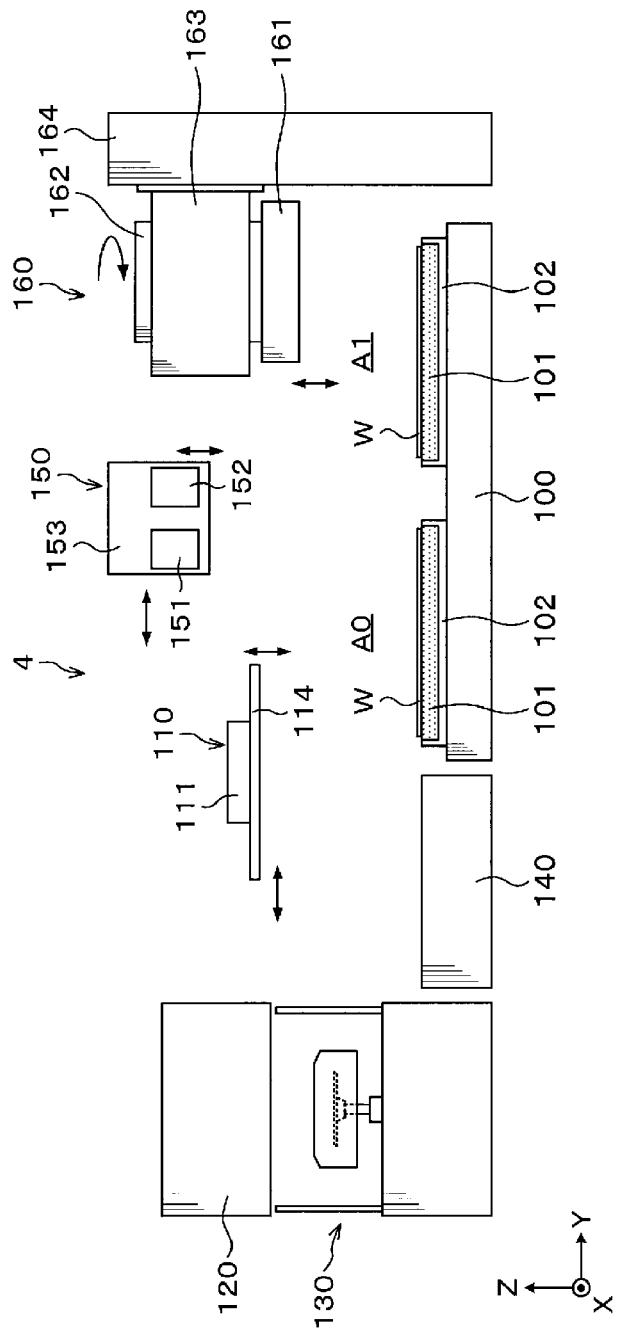
FIG. 4 is a side view schematically illustrating the configuration of the processing device as taken along a line A-A of FIG. 3.
Figure 5:
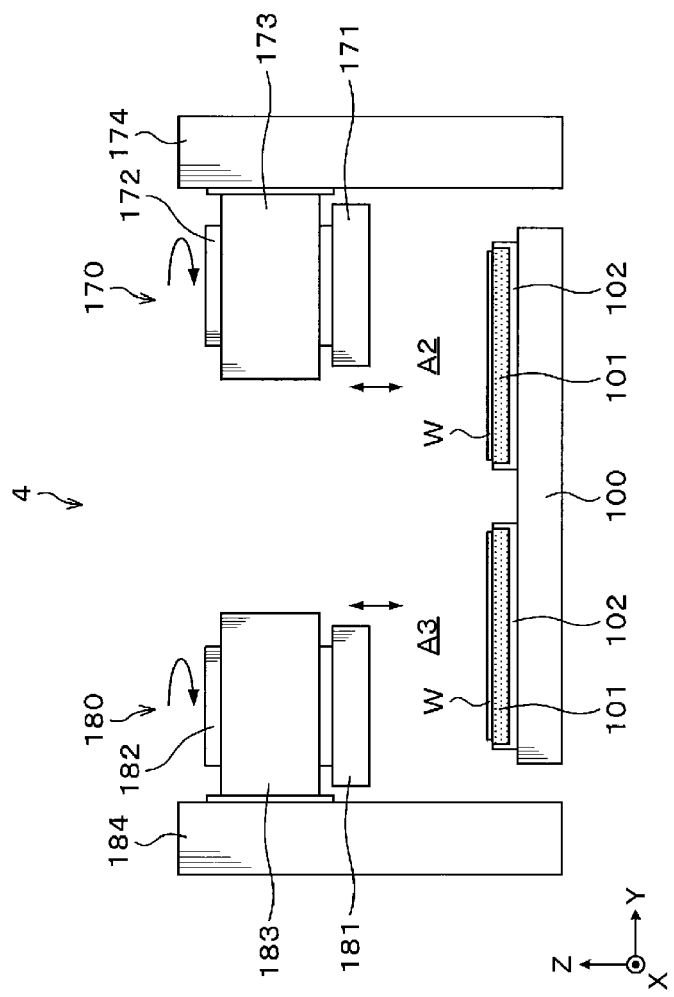
FIG. 5 is a side view schematically illustrating the configuration of the processing device as taken along a line B-B of FIG. 3.

Hereinafter, the configuration of the processing device 4 will be described. As illustrated in FIG. 3 to FIG. 5, the processing device 4 includes a rotary table 100, a transfer unit 110 as a transfer device, an alignment unit 120 as an alignment device, a first cleaning unit 130 as a processing surface cleaning device, a second cleaning unit 140 as a cleaning device, a third cleaning unit 150, a rough grinding unit 160 as a processor, an intermediate grinding unit 170 as a processor, and a finish grinding unit 180 as a processor.

The rotary table 100 is configured to be rotatable by a rotating mechanism (not illustrated). Four chucks 101 serving as first holders configured to attract and hold the wafer W are provided on the rotary table 100. The chucks 101 are arranged concentrically with the rotary table 100 at the same angular interval, i.e., every 90 degrees. The four chucks 101 are configured to be movable to a delivery position A0 and processing positions A1 to A3 when the rotary table 100 is rotated.

In the present exemplary embodiment, the delivery position A0 is a position at the positive X-axis direction side and the negative Y-axis direction side of the rotary table 100, and the third cleaning unit 150 is placed at the delivery position A0. At the negative Y-axis direction side of the delivery position A0, the second cleaning unit 140, the alignment unit 120 and the first cleaning unit 130 are arranged in series. That is, the delivery position A0, the second cleaning unit 140, the alignment unit 120 and the first cleaning unit 130 are arranged in series in a direction (Y-axis direction) in which the wafer transfer device 32 transfers wafers W to the processing device 4. Also, the alignment unit 120 and the first cleaning unit 130 are sequentially stacked from the top. The first processing position A1 is a position at the positive X-axis direction side and the positive Y-axis direction side of the rotary table 100 and the rough grinding unit 160 is placed at the first processing position A1. The second processing position A2 is a position at the negative X-axis direction side and the positive Y-axis direction side of the rotary table 100 and the intermediate grinding unit 170 is placed at the second processing position A2. The third processing position A3 is a position at the negative X-axis direction side and the negative Y-axis direction side of the rotary table 100 and the finish grinding unit 180 is placed at the third processing position A3.

The chuck 101 is held on a chuck base 102. The chuck 101 and the chuck base 102 are configured to be rotatable by the rotating mechanism (not illustrated).

Figure 6A:
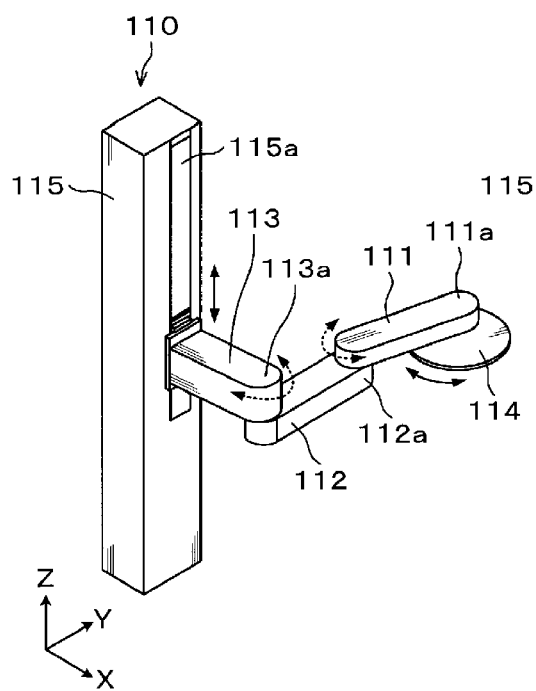
FIG. 6A and FIG. 6B provide perspective views schematically illustrating a configuration of a transfer unit 110.
Figure 6B:
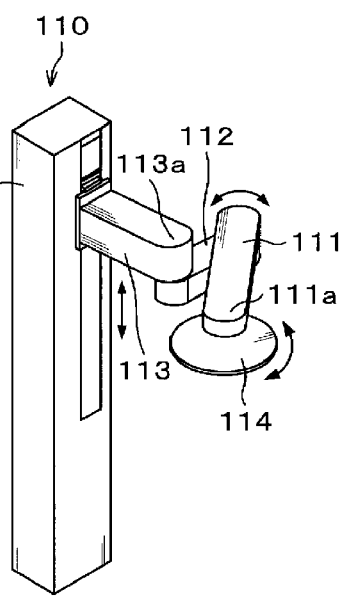

As illustrated in FIG. 6A and FIG. 6B, the transfer unit 110 is a multi-joint robot having a plurality of, e.g., three, arms 111 to 113. Among the three arms 111 to 113, a first arm 111 at a tip end thereof is provided with a transfer pad 114 serving as a second holder (substrate holder) configured to attract and hold the wafer W. Also, a third arm 113 at a base end thereof is provided at a vertical moving mechanism 115 configured to move the arms 111 to 113 in the vertical direction.

The transfer pad 114 has a circular shape having a greater diameter than the wafer W when viewed from the top. Also, the transfer pad 114 includes the suction openings (not illustrated) in the bottom surface thereof, and the suction openings are connected to the suction mechanism (not illustrated) configured to perform the evacuation. Thus, the transfer pad 114 attracts and holds the entire processing surface of the wafer W. Further, the transfer pad 114 is supported on a tip end portion of the first arm 111. A rotary unit 111a is embedded in the tip end portion of the first arm 111 and includes, for example, a motor or the like. The transfer pad 114 is configured to be rotatable by the rotary unit 111a.

The three arms 111 and 113 are connected to each other by joint members 112a and 113a. That is, a base end portion of the first arm 111 is connected to a tip end portion of the second arm 112 by the joint member 112a embedded in the tip end portion of the second arm 112. The joint member 112a includes, for example, a motor or the like, and the first arm 111 is configured to be pivotable around the base end portion by the joint member 112a. Likewise, a base end portion of the second arm 112 is connected to a tip end portion of the third arm 113 by the joint member 113a embedded in the tip end portion of the third arm 113. The joint member 113a also includes, for example, a motor or the like, and the second arm 112 is configured to be pivotable around the base end portion by the joint member 113a.

The vertical moving mechanism 115 includes a guide 115a extending in the vertical direction, and the base end portion of the third arm 113 is mounted on the guide 115a. Further, a driver (not illustrated) including, such as a motor or the like, is embedded in the vertical moving mechanism 115, and the third arm 113 (arms 111 to 113) is configured to be movable in the vertical direction along the guide 115a by the driver.

Figure 7:
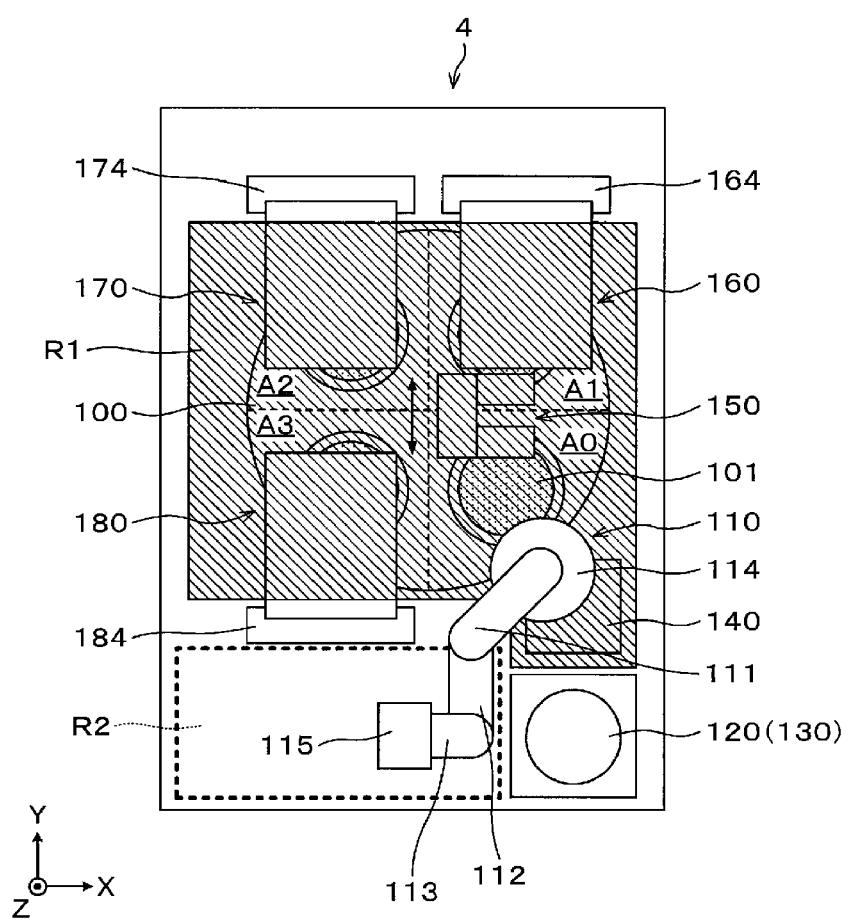
FIG. 7 is a diagram provided to explain a wet environment area and a dry environment area of the processing device.

Here, as illustrated in FIG. 7, when the processing surface of the wafer W is ground by the grinding units 160, 170 and 180 at the processing positions A1 to A3, water is supplied. Also, when the processing surface of the wafer W is roughly cleaned by the third cleaning unit 150 at the delivery position A0, a cleaning solution is supplied. Further, when the non-processing surface of the wafer W is cleaned by the second cleaning unit 140, the cleaning solution is also supplied. For this reason, an area where the water or the cleaning solution is supplied is a wet environment area R1 (shaded area in FIG. 7) containing moisture. Further, in the wet environment area R1, when the processing surface of the wafer W is ground by the grinding units 160, 170 and 180, ground residues are also generated.

Therefore, desirably, the vertical moving mechanism 115 is placed in a dry environment area R2 (dotted area in FIG. 7) separated from the wet environment area R1. Specifically, the dry environment area R2 refers to an area at the negative Y-axis direction side of a column 184 of the finish grinding unit 180 which will be described later. In this case, the driver of the vertical moving mechanism 115 can be operated appropriately without being exposed to the moisture or the like. Further, although the guide 115a of the vertical moving mechanism 115 is opened, a seal mechanism for protecting the guide 115a which is a sliding portion is not needed. Therefore, the configuration of the device can be simplified. Also, the dry environment area R2 is located at the transfer station 6 side and thus can be easily accessed from the transfer station 6. Therefore, the maintenance of the vertical moving mechanism 115 can be easily performed.

Furthermore, the rotary unit 111a and the joint members 112a and 113a are embedded and sealed in the arms 111 to 113, respectively. Therefore, no further protection is needed even in the wet environment area R1.

The transfer unit 110 having the above-described configuration can transfer the wafer W to the delivery position A0, the alignment unit 120, the first cleaning unit 130 and the second cleaning unit 140.

Figure 8:
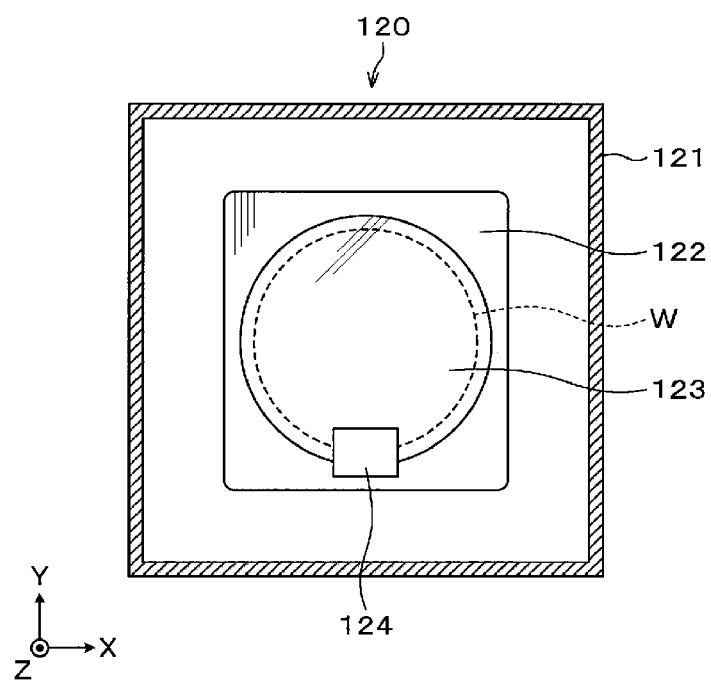
FIG. 8 is a plan view schematically illustrating a configuration of an alignment unit.

In the alignment unit 120, an orientation in the horizontal direction of the wafer W before the grinding is adjusted. As illustrated in FIG. 8, the alignment unit 120 includes a processing chamber 121, and a base table 122, a spin chuck 123 and a detector 124 are provided within the processing chamber 121. The spin chuck 123 is configured to attract and hold the wafer W and to be rotatable by the rotating mechanism (not illustrated). The detector 124 may detect a position of a notch of the wafer W by capturing an image of an outer peripheral portion of the wafer W or by irradiating a laser beam to a peripheral portion of the wafer W. Further, by detecting the position of the notch of the wafer W with the detector 124 while rotating the wafer W held on the spin chuck 123, the position of the notch is adjusted to adjust the orientation in the horizontal direction of the wafer W.

Under the alignment unit 120, the first cleaning unit 130 is placed. Since the first cleaning unit 130 includes a spin chuck 133 as will be described later, the spin chuck 133 is rotated at a high speed and thus vibrated during the cleaning. If vibration is transmitted to the alignment unit 120, it is difficult to appropriately adjust the orientation in the horizontal direction of the wafer W. Therefore, desirably, the processing chamber 121 is supported independently from the first cleaning unit 130. The processing chamber 121 may be supported in any way. For example, the processing chamber 121 may be supported on a support member provided in the wet environment area R1 or on a housing (side wall) of the processing device 4, or may be suspended from and supported on a ceiling surface of the processing device 4.

In the first cleaning unit 130, the processing surface of the wafer W obtained after the grinding is cleaned and more specifically spin-cleaned.

As illustrated in FIG. 9A and FIG. 9B and FIG. 10A and FIG. 103, the first cleaning unit 130 has a support plate 131 having a rectangular shape. The first cleaning unit 130 can be accessed by the first arm 111 and the transfer pad 114 of the transfer unit 110 from the positive X-axis direction and the positive Y-axis direction. For this reason, the support plate 131 is opened in the positive X-axis direction and the positive Y-axis direction.

A shutter 132 is provided around the support plate 131. A top surface and a bottom surface of the shutter 132 are opened. The shutter 132 is configured to be movable in the vertical direction to an upper side and a lower side of the support plate 131 by an elevating mechanism (not illustrated). Further, the shutter 132 is not limited to the illustrated rectangular shape and may have a shape, e.g., a circular shape, surrounding the support plate 131 when viewed from the top.

Figure 9A:
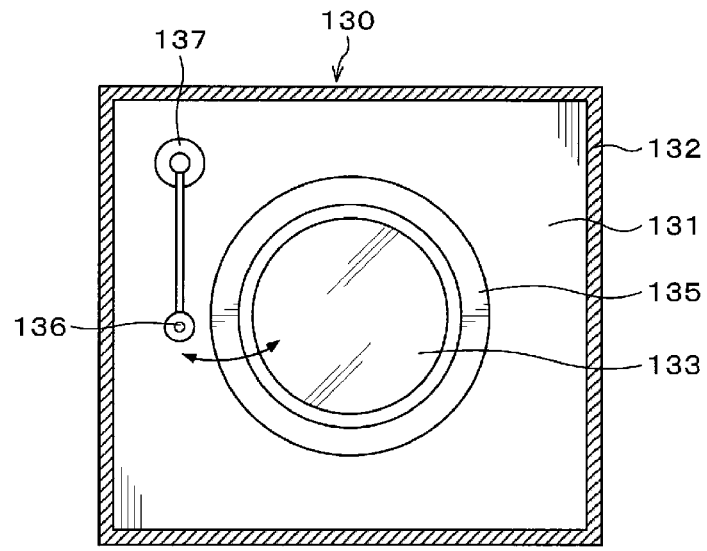
FIG. 9A and FIG. 9B provide plan views schematically illustrating a configuration of a first cleaning unit.
Figure 10A:
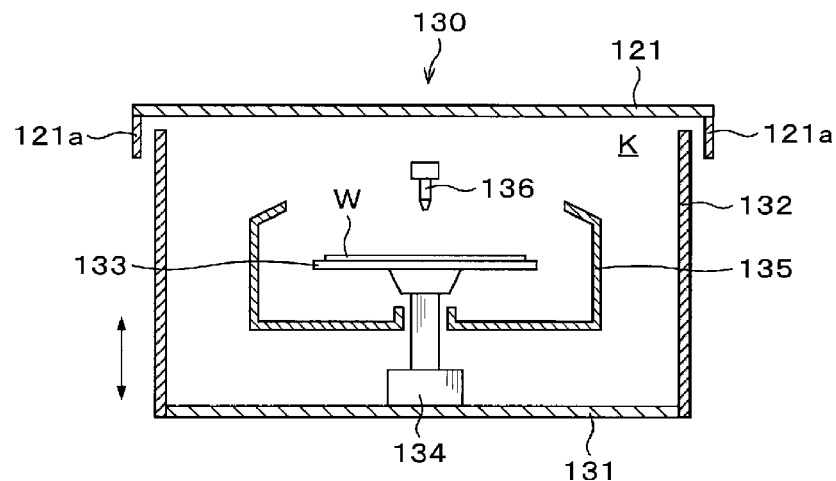
FIG. 10A and FIG. 10B provide side views schematically illustrating the configuration of the first cleaning unit.

As illustrated in FIG. 9A and FIG. 10A, when the shutter 132 is located on the upper side of the support plate 131, the shutter 132 is placed with a little gap from a bottom surface of the processing chamber 121 in the alignment unit 120. This gap makes it possible to suppress the transmittance of the vibration generated during the cleaning in the first cleaning unit 130 to the alignment unit 120. Further, a processing space K is formed by the support plate 131, the shutter 132 and the processing chamber 121. Furthermore, a skirt portion 121a is provided on the bottom surface of the processing chamber 121 and outside the shutter 132 so as to cover the gap between the bottom surface of the processing chamber 121 and the shutter 132. The skirt portion 121a suppresses the scattering of the cleaning solution to the outside during the cleaning of the wafer W.

Figure 9B:
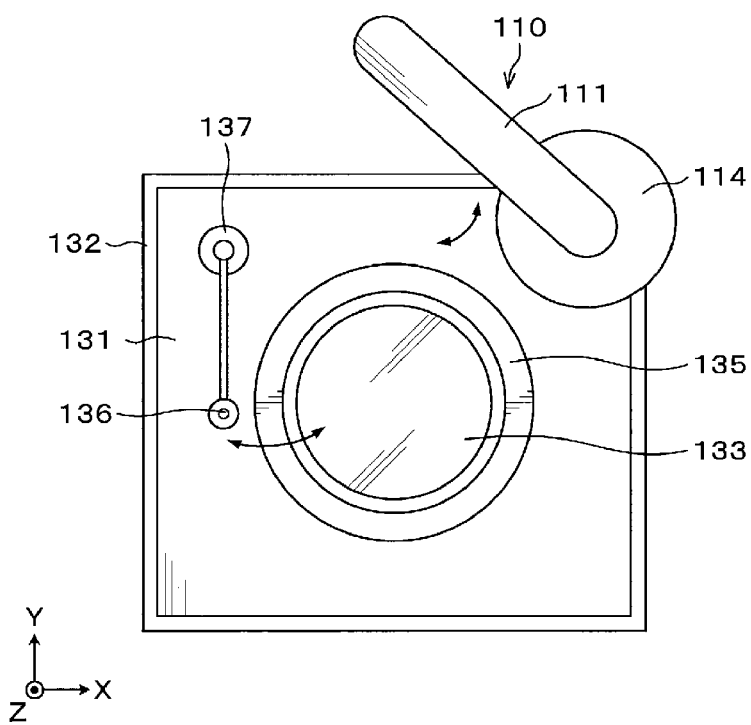
Figure 10B:
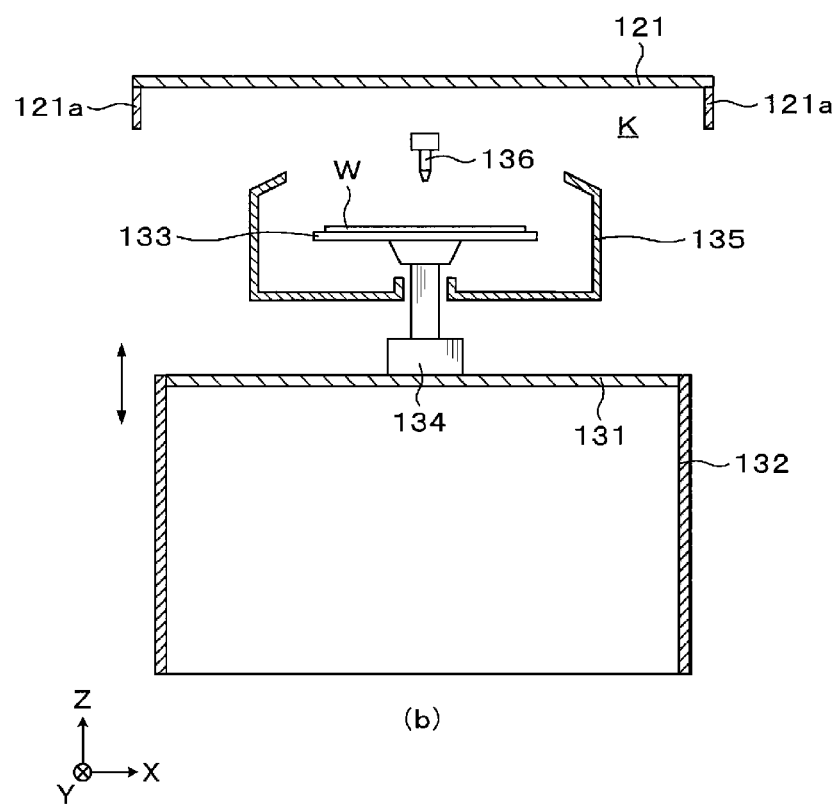

As illustrated in FIG. 9B and FIG. 10B, when the shutter 132 is located on the lower side of the support plate 131, the processing space K is opened. Then, the wafer W is transferred to the processing space K by the transfer unit 110. Also, the opened processing space K can be accessed by the transfer pad 34 of the wafer transfer device 32 from a direction different than that of the transfer unit 110, i.e., from the transfer station 6 side.

The spin chuck 133 configured to hold and rotate the wafer W is provided at a central portion of the processing space K. The spin chuck 133 attracts and holds the wafer W. A driver 134 including, for example, a motor or the like is provided under the spin chuck 133. The spin chuck 133 can be rotated at a predetermined speed and elevated by the driver 134. A cup 135 configured to receive and recover a liquid scattered or dropped from the wafer W is provided around the spin chuck 133.

A cleaning solution nozzle 136 supplies a cleaning solution, e.g., pure water, to the processing surface of the wafer W. Also, the cleaning solution nozzle 136 is configured to be movable in the horizontal direction and the vertical direction by a moving mechanism 137. While the wafer W held on the spin chuck 133 is rotated, the cleaning solution is supplied to the processing surface of the wafer W from the cleaning solution nozzle 136. Then, the supplied cleaning solution is diffused over the processing surface of the wafer W so that the processing surface is cleaned.

Figure 11:
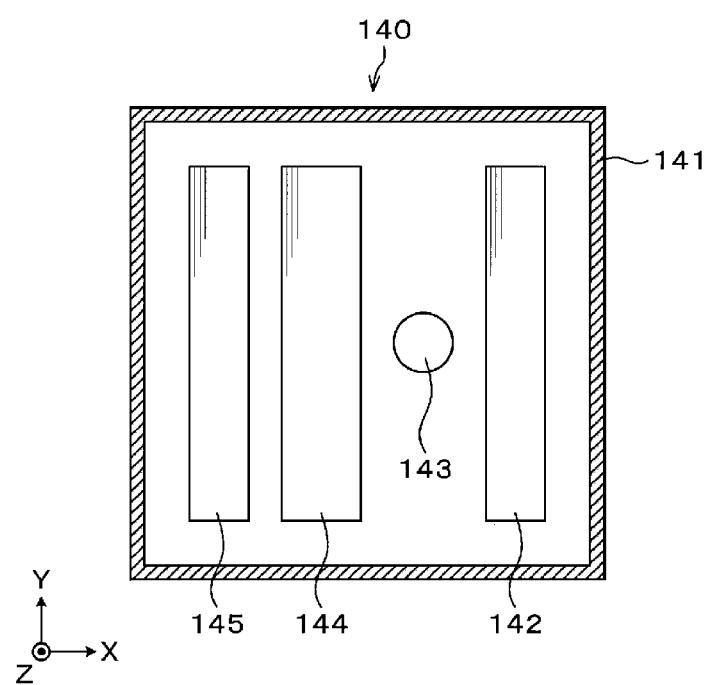
FIG. 11 is a plan view schematically illustrating a configuration of a second cleaning unit.

In the second cleaning unit 140, the non-processing surface of the wafer W, as the ground wafer W, held on the transfer pad 114 of the transfer unit 110 is cleaned and the transfer pad 114 is cleaned. As illustrated in FIG. 11, the second cleaning unit 140 includes a processing chamber 141, and a sponge cleaning tool 142 having a cleaning solution nozzle, an air nozzle 143, a stone cleaning tool 144 (whetstone) and a brush cleaning tool 145 are provided inside the processing chamber 141. Each of the sponge cleaning tool 142, the air nozzle 143, the stone cleaning tool 144 and the brush cleaning tool 145 is configured to be movable in the vertical direction by an elevating mechanism (not illustrated).

The sponge cleaning tool 142 has, for example, sponge extending longer than the diameter of the wafer W. A cleaning solution, e.g., pure water, can be supplied to the sponge to clean the non-processing surface of the wafer W and more specifically a protective tape attached to the non-processing surface. The air nozzle 143 discharges air to the non-processing surface of the wafer W to dry the non-processing surface. The cleaning of the non-processing surface with the sponge and the cleaning solution and the drying of the non-processing surface with the air are performed while the wafer W is held on the transfer pad 114 and while the transfer pad 114 (wafer W) is rotated by the rotary unit 111a, respectively. In this way, the entire non-processing surface of the wafer W is cleaned.

Each of the stone cleaning tool 144 and the brush cleaning tool 145 extends longer than, for example, the diameter of an attraction surface of the wafer W in the transfer pad 114 of the transfer unit 110 and brought into contact with the attraction surface to perform the cleaning. Further, the cleaning of the transfer pad 114 by the stone cleaning tool 144 and the brush cleaning tool 145 is performed while the transfer pad 114 is rotated by the rotary unit 111a. In this way, the entire surface of the transfer pad 114 is cleaned.

In the third cleaning unit 150, the processing surface of the ground wafer W and the chuck 101 are cleaned. As illustrated in FIG. 3 and FIG. 4, the third cleaning unit 150 is equipped with a cleaning solution nozzle 151, a stone cleaning tool 152 (whetstone) and a moving mechanism 153. Each of the cleaning solution nozzle 151 and the stone cleaning tool 152 is configured to be movable in the horizontal direction and the vertical direction by the moving mechanism 153.

The cleaning solution nozzle 151 supplies a cleaning solution, e.g., pure water, to the processing surface of the wafer W. Further, while the wafer W held on the chuck 101 is rotated, the cleaning solution nozzle 151 supplies the cleaning solution to the processing surface of the wafer W. Then, the supplied cleaning solution is diffused over the processing surface of the wafer W so that the processing surface is cleaned.

The stone cleaning tool 152 is brought into contact with the surface of the chuck 101 to perform cleaning. Here, a cleaning solution, e.g., pure water, may be supplied to the surface of the chuck 101 from a nozzle (not illustrated).

In the rough grinding unit 160, the processing surface of the wafer W is roughly ground. The rough grinding unit 160 is equipped with a rough grinding whetstone 161 having an annular shape. The rough grinding whetstone 161 is equipped with a driver 163 via a spindle 162. The driver 163 includes, for example, a motor (not illustrated) and rotates the rough grinding whetstone 161 and also moves the rough grinding whetstone 161 in the horizontal direction (X-axis direction) and the vertical direction along a column 164. Further, the rear surface of the wafer W is roughly ground by rotating each of the chuck 101 and the rough grinding whetstone 161 in a state where the wafer W held on the chuck 101 is in contact with a part of a circular arc of the rough grinding whetstone 161. Here, a grinding solution, e.g., water, is supplied to the rear surface of the wafer W.

In the intermediate grinding unit 170, intermediate grinding is performed on the rear surface of the wafer W. As illustrated in FIG. 3 and FIG. 5, the intermediate grinding unit 170 has approximately the same configuration as the rough grinding unit 160 and is equipped with an intermediate grinding whetstone 171, a spindle 172, a driver 173 and a column 174. Further, the intermediate grinding whetstone 171 has a smaller particle size than the rough grinding whetstone 161. Furthermore, while the grinding solution is supplied to the rear surface of the wafer W held on the chuck 101, the rear surface of the wafer W is ground by rotating each of the chuck 101 and the intermediate grinding whetstone 171 in a state where the rear surface is in contact with a part of a circular arc of the intermediate grinding whetstone 171.

In the finish grinding unit 180, finish grinding is performed to the rear surface of the wafer W. The finish grinding unit 180 has approximately the same configuration as the rough grinding unit 160 and the intermediate grinding unit 170 and is equipped with a finish grinding whetstone 181, a spindle 182, a driver 183 and the column 184. Further, the finish grinding whetstone 181 has a smaller particle size than the intermediate grinding whetstone 171. Furthermore, while the grinding solution is supplied to the rear surface of the wafer W held on the chuck 101, the rear surface of the wafer W is ground by rotating each of the chuck 101 and the finish grinding whetstone 181 in a state where the rear surface is in contact with a part of a circular arc of the finish grinding whetstone 181.

Hereinafter, a wafer processing to be performed using the substrate processing system 1 will be described.

The cassette C accommodating the wafers W therein is placed on the cassette placing table 10 of the carry-in station 2. In the cassette C, each wafer W is accommodated such that the front surface of the wafer W to which the protective tape is attached faces upward in order to suppress the deformation of the protective tape.

Then, the wafer W is taken out from the cassette C by the transfer fork 33 of the wafer transfer device 32 and then transferred to the processing device 4. Here, the front and rear surfaces of the wafer W are reversed by the transfer fork 33 such that the processing surface of the wafer W faces upward.

The wafer W transferred to the processing device 4 is delivered to the spin chuck 123 of the alignment unit 120. Then, in the alignment unit 120, the orientation in the horizontal direction of the wafer W is adjusted (process S1 in FIG. 12).

Figure 12:
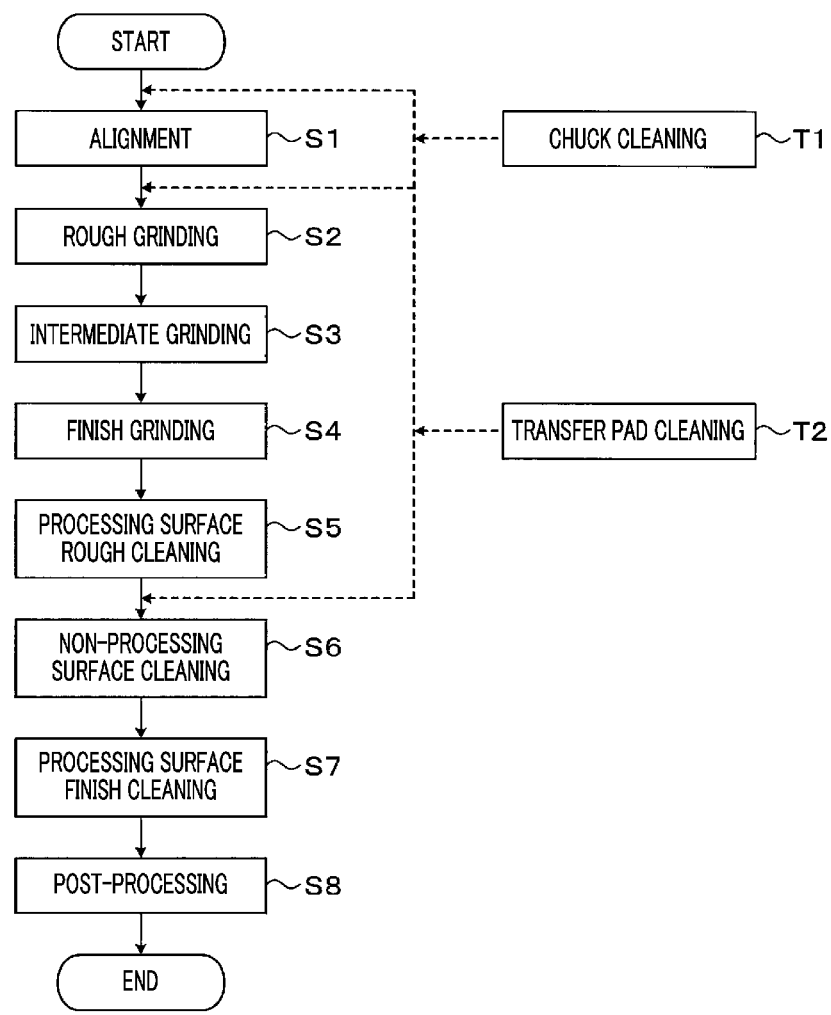
FIG. 12 is a flowchart showing main processes of a wafer processing.
Figure 13A:
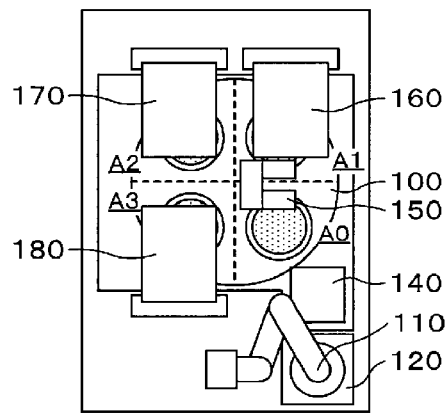
FIG. 13A to FIG. 13D are provided to explain movements of the transfer unit 110 in the main processes of the wafer processing.
Figure 13C:
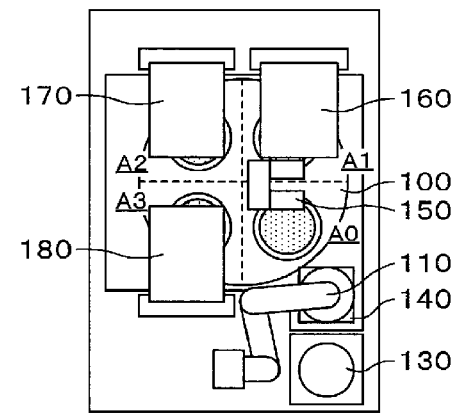
Figure 13B:
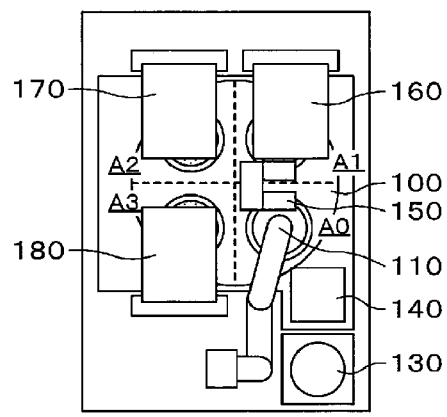

Then, as illustrated in FIG. 13A and FIG. 13B, the wafer W is transferred by the transfer unit 110 from the alignment unit 120 to the delivery position A0 and delivered to the chuck 101 at the delivery position A0. Thereafter, the rotary table 100 is rotated counterclockwise 90 degrees to move the chuck 101 to the first processing position A1. Then, the processing surface of the wafer W is roughly ground by the rough grinding unit 160 (process S2 in FIG. 12).

Further, before the wafer W is held on the chuck 101 in the process S2, the chuck 101 has been cleaned using the stone cleaning tool 152 of the third cleaning unit 150 (process T1 in FIG. 12). The cleaning of the chuck 101 is performed at any time before the process S2.

Then, the rotary table 100 is rotated counterclockwise 90 degrees to move the chuck 101 to the second processing position A2. Thereafter, the intermediate grinding unit 170 performs the intermediate grinding to the rear surface of the wafer W (process S3 in FIG. 12).

Then, the rotary table 100 is rotated counterclockwise 90 degrees to move the chuck 101 to the third processing position A3. Thereafter, the finish grinding unit 180 performs the finish grinding to the rear surface of the wafer W (process S4 in FIG. 12).

Then, the rotary table 100 is rotated counterclockwise 90 degrees or the rotary table 100 is rotated clockwise 270 degrees to move the chuck 101 to the delivery position A0. Thereafter, the processing surface of the wafer W is roughly cleaned with the cleaning solution by using the cleaning solution nozzle 151 of the third cleaning unit 150 (process S5 in FIG. 12). In this process S5, the cleaning is performed to clear the contaminants on the processing surface to a certain level.

Then, as illustrated in FIG. 13C, the wafer W is transferred by the transfer unit 110 from the delivery position A0 to the second cleaning unit 140. Here, although the wafer W has been thinned, the transfer pad 114 attracts and holds the entire processing surface of the wafer W. Further, in the second cleaning unit 140, the non-processing surface of the wafer W is cleaned by the sponge cleaning tool 142 in a state where the wafer W is held and rotated on the transfer pad 114 (process S6 in FIG. 12). Further, in the state where the wafer W is held and rotated on the transfer pad 114, the air nozzle 143 discharges the air to the non-processing surface to dry the non-processing surface.

In the process S6, before the wafer W is transferred by the transfer unit 110, the transfer pad 114 of the transfer unit 110 has been cleaned using the stone cleaning tool 144 and the brush cleaning tool 145 of the second cleaning unit 140 (process T2 in FIG. 12). The cleaning of the transfer pad 114 by the stone cleaning tool 144 and the brush cleaning tool 145 is performed while the transfer pad 114 is rotated by the rotary unit 111a. Also, the cleaning of the transfer pad 114 is performed at any time before the process S6.

Figure 13D:
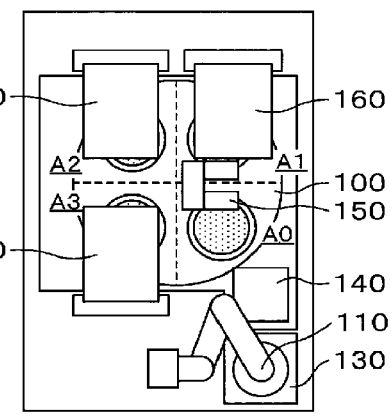

Then, as illustrated in FIG. 13D, the wafer W is transferred by the transfer unit 110 from the second cleaning unit 140 to the first cleaning unit 130. When the wafer W is transferred, the shutter 132 is located on the lower side of the support plate 131 and the processing space K is opened in the first cleaning unit 130. Thereafter, the wafer W is delivered to the spin chuck 133 and the transfer unit 110 is retreated from the first cleaning unit 130. Then, the shutter 132 is moved up to be located on the upper side of the support plate 131, and, thus, the processing space K is formed. Thereafter, while the wafer W held on the spin chuck 133 is rotated, the cleaning solution nozzle 136 supplies the cleaning solution to the processing surface of the wafer W to perform the finish cleaning to the processing surface (process S7 in FIG. 12). In the process S7, the processing surface of the wafer W is cleaned to a desired degree of cleanliness and dried. Then, when the finish cleaning and the drying of the processing surface of the wafer W is ended, the shutter 132 is moved down to be located on the lower side of the support plate 131, and, thus, the processing space K is opened.

Then, the wafer W is transferred by the wafer transfer device 32 from the first cleaning unit 130 to the post-processing device 5. Here, although the wafer W has been thinned, the transfer pad 34 attracts and holds the entire processing surface of the wafer W. Further, in the post-processing device 5, the post-processing, such as the mounting processing of holding the wafer W on a dicing frame and the peeling processing of peeling the protective tape attached to the wafer W, is performed (process S8 in FIG. 12).

Then, the wafer W which has undergone all the processings is transferred to the cassette C on the cassette placing table 20 of the carry-out station 3. In this way, a series of wafer processings in the substrate processing system 1 is ended.

During the series of wafer processings, when the operation of the transfer unit 110 is stopped in the processing device 4, the transfer pad 114 of the transfer unit 110 is located above the second cleaning unit 140, i.e., a standby position. During this standby state, the transfer pad 114 is desirably located higher than the chuck 101 of the rotary table 100 (the delivery position A0 and the processing positions A1 to A3). In the above-described processes S2 to S4, when the processing surface of the wafer W is ground by the grinding units 160, 170 and 180, ground residues are generated and contaminated air containing the ground residues flows out from the chuck 101 side. Therefore, while the transfer pad 114 is in the standby state, the transfer pad 114 is located higher than the chuck 101 to suppress the contamination of the transfer pad 114 with the contaminated air.

According to the above-described exemplary embodiments, the transfer unit 110 in the processing device 4 is the multi-joint robot having three arms 111 to 113, and each of the arms 111 to 113 can be moved independently. Therefore, the transfer pad 114 can access the delivery position A0, the alignment unit 120, the first cleaning unit 130 and the second cleaning unit 140. Also, the wafer W can be transferred to the delivery position A0 and each of the units 120, 130 and 140 by the single transfer unit 110, and, thus, the transfer unit 110 can have a high degree of movement freedom. Further, there is only one wafer transfer device, and, thus, the configuration of the processing device 4 can be simplified. Therefore, it is possible to efficiently perform the wafer processing.

Furthermore, in the processing device 4, the delivery position A0, the second cleaning unit 140, the alignment unit 120 and the first cleaning unit 130 are arranged in series with each other in the Y-axis direction, and, thus, the access range of the transfer unit 110 can be reduced. Therefore, it is possible to efficiently transfer the wafer W.

Moreover, in the processing device 4, the alignment unit 120 and the first cleaning unit 130 are stacked, and, thus, the footprint of the processing device 4 can be reduced. As a result, the degree of installation freedom of the processing device 4 can be improved. Further, since the alignment unit 120 and the first cleaning unit 130 are stacked, the maintenance of these units 120 and 130 can be easily performed.

Also, the alignment unit 120 and the first cleaning unit 130 are sequentially stacked from the top, i.e., the first cleaning unit 130 that performs the liquid processing is placed under the alignment unit 120. In this case, the liquid drain from the first cleaning unit 130 can be easily performed from a lower part of the first cleaning unit 130, and particles generated in the first cleaning unit 130 do not enter the alignment unit 120. Herein, the sequence of stacking the alignment unit 120 and the first cleaning unit 130 is not limited thereto.

According to the present exemplary embodiment, in the single substrate processing system 1, a series of processings can be performed consecutively to the wafers W, and, thus, the throughput can be improved.

The configuration of the substrate processing system 1 is not limited to the above-described exemplary embodiments. For example, the alignment unit 120 and the first cleaning unit 130 are stacked in the processing device 4, but may be arranged in series with each other in the horizontal direction. However, to reduce the footprint, it is desirable to stack these units. Otherwise, the first cleaning unit 130 may be provided outside the processing device 4, e.g., between the processing device 4 and the post-processing device 5.

Also, in the processing device 4, the second cleaning unit 140 is arranged in series with the alignment unit 120 and the first cleaning unit 130 in the horizontal direction, but may be stacked on the alignment unit 120 and the first cleaning unit 130. However, the transfer pad 114 of the transfer unit 110 is necessarily located at the standby position, and, thus, it is more efficient to place the second cleaning unit 140 at the standby position in terms of layout.

Further, in the processing device 4, the vertical moving mechanism 115 of the transfer unit 110 is fixed in the dry environment area R2, but may be configured to be movable, for example, in the Y-axis direction in FIG. 1. In this case, any one of the three arms 111 to 113 may be omitted.

Also, in the substrate processing system 1, another wafer transfer device may be provided, for example, between the processing device 4 and the post-processing device 5. This wafer transfer device may transfer a wafer W, for example, from the first cleaning unit 130 to the post-processing device 5.

Further, in the substrate processing system 1, the post-processing device 5 performs the mounting processing and the peeling processing, but may perform the dicing processing to the wafer W. Otherwise, the substrate processing system 1 may further include a dicing device configured to perform the dicing processing in addition to the processing device 4 and the post-processing device 5. The dicing processing of the wafer W may be performed before or after the grinding of the wafer W in the processing device 4. Alternatively, the substrate processing system 1 may omit the post-processing device 5, and the mounting processing, the peeling processing and the dicing processing may be performed outside the substrate processing system 1. In this case, the wafer W which has been ground in the processing device 4 is transferred by the transfer pad 34 of the wafer transfer device 32 from the first cleaning unit 130 to the cassette placing table 10.

Then, the configuration of the transfer unit 110 in the processing device 4 of the substrate processing system 1 according to the above-described exemplary embodiments will be described in more detail. That is, the transfer pad 114 of the transfer unit 110 is configured to be switchably tilted or fixed when viewed from the side. Each of a mechanism (hereinafter, referred to as "tilting mechanism") configured to allow the transfer pad 114 to be tilted and a mechanism (hereinafter, referred to as "fixing mechanism") configured to stop the tilting of the transfer pad 114 may have any configuration. An example thereof will be described below.

Figure 14A:
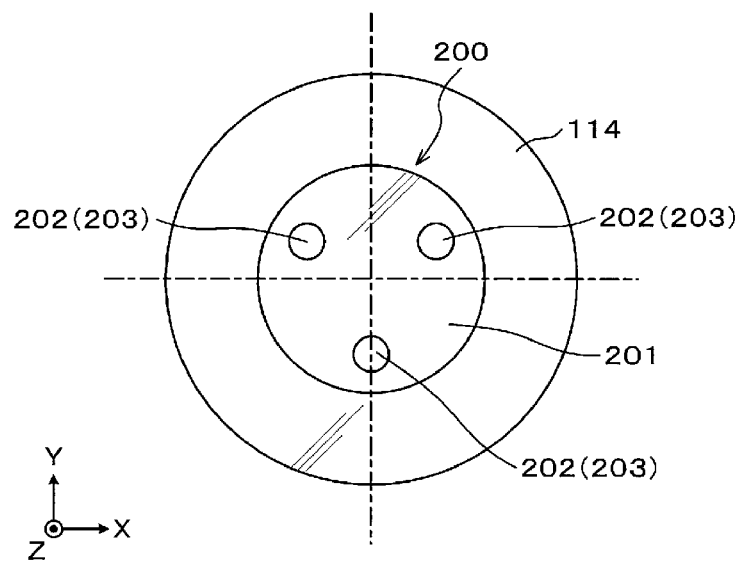
FIG. 14A and FIG. 14B are provided to schematically explain a configuration of a tilting mechanism of the transfer pad.
Figure 14B:
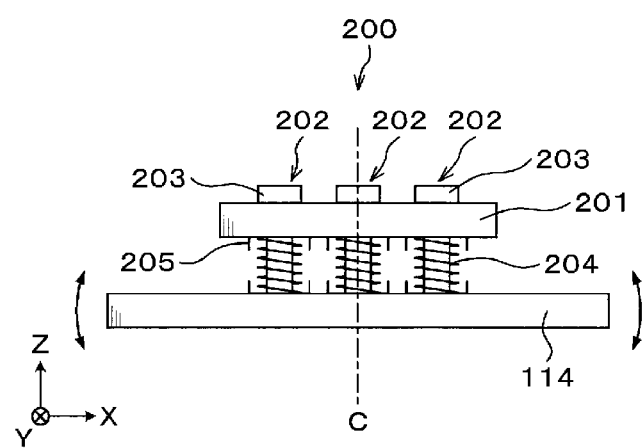

FIG. 14A and FIG. 14B are provided to schematically explain a configuration of a tilting mechanism 200 of the transfer pad 114, and FIG. 14A is a plan view and a FIG. 14B is a side view. The tilting mechanism 200 includes a support plate 201 and force applying units 202. The support plate 201 has a circular plate shape and is provided above the transfer pad 114. Also, the support plate 201 is arranged concentrically with the transfer pad 114. Further, the support plate 201 is supported by the first arm 111.

The force applying units 202 force the transfer pad 114 with respect to the support plate 201 in a separating direction. The force applying units 202 are provided at a plurality of, e.g., three, positions, and the three force applying units 202 are equi-spaced concentrically with the support plate 201. The transfer pad 114 is configured to be tilted around a central axis C of the transfer pad 114 in the vertical direction by the three force applying units 202.

Figure 15:
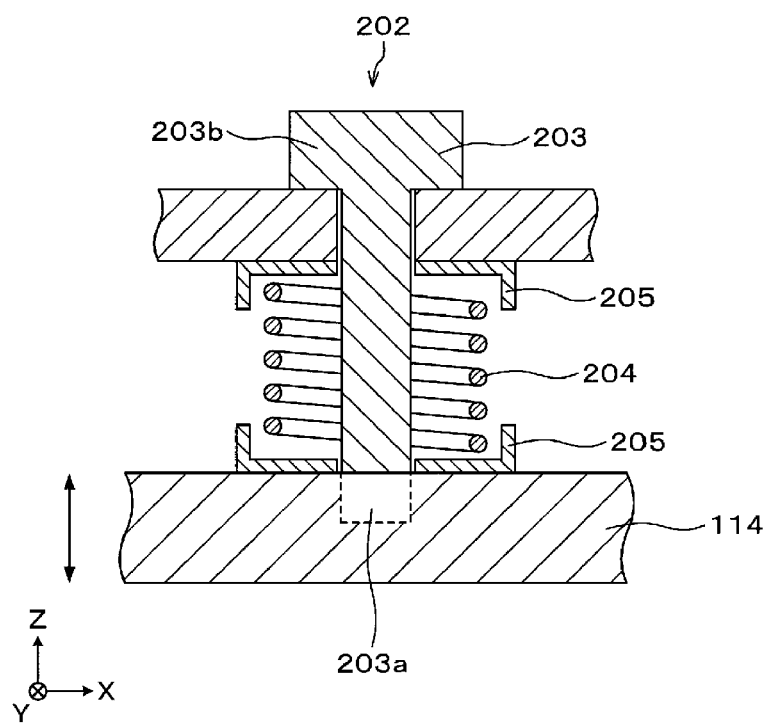
FIG. 15 is a cross-sectional view schematically illustrating the configuration of a force applying unit of a tilting mechanism.

As illustrated in FIG. 15, each force applying unit 202 includes a bolt 203, a spring 204 and a housing 205. A tip end portion 203a of the bolt 203 is fixed to the transfer pad 114. A bolt head 203b of the bolt 203 is provided on a top surface of the support plate 201 so as to be movable up and down. The spring 204 is provided on an outer peripheral surface of the bolt 203. The spring 204 is accommodated in the housing 205. With this configuration, the force applying units 202 can force the transfer pad 114 with respect to the support plate 201.

Figure 16:
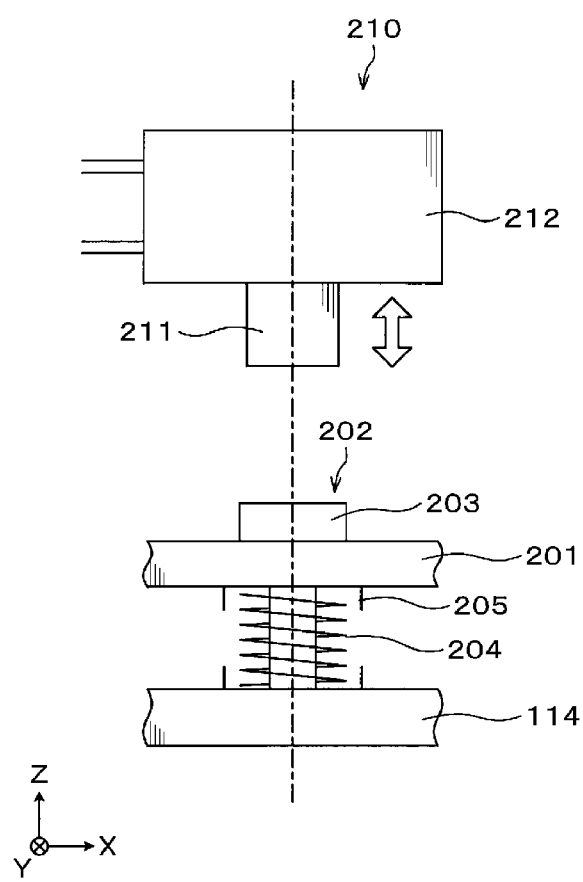
FIG. 16 is provided to schematically explain a configuration of a fixing mechanism for the transfer pad.

FIG. 16 is a side view schematically illustrating a configuration of a fixing mechanism 210 for the transfer pad 114. The fixing mechanism 210 is provided above each force applying unit 202. Each fixing mechanism 210 includes a lock member 211 and a cylinder 212. The lock member 211 is provided above the bolt 203 and extends in the vertical direction. The cylinder 212 is configured to move the lock member 211 in the vertical direction. With this configuration, the fixing mechanism 210 may bring the lock member 211 into contact with the bolt head 203b of the bolt 203 and thus can fix an up-and-down movement of the transfer pad 114. Also, the fixing mechanism 210 may locate the lock member 211 so as not to be in contact with the bolt 203 and thus can move the transfer pad 114 up and down.

Hereinafter, operations of the tilting mechanism 200 and the fixing mechanism 210 will be described in line with the above-described wafer processing in the substrate processing system 1. In the following, when the transfer pad 114 is allowed to be tilted, the lock member 211 of the fixing mechanism 210 is not in contact with the bolt 203 of the tilting mechanism 200 and the transfer pad 114 can be freely tilted by the tilting mechanism 200. Also, when the tilting of the transfer pad 114 is stopped, the lock member 211 is brought into contact with the bolt 203 and the up-and-down movement of the transfer pad 114 is locked.

First, when the wafer W is taken out from the alignment unit 120 by the transfer unit 110 after the orientation in the horizontal direction of the wafer W is adjusted by the alignment unit 120 in the process S1, the transfer pad 114 is allowed to be tilted. Therefore, for example, even if the wafer W held on the spin chuck 123 is not horizontal, the transfer pad 114 can be tilted according to the inclination and thus can appropriately receive the wafer W.

Then, while the wafer W is transferred by the transfer unit 110 from the alignment unit 120 to the delivery position A0, the tilting of the transfer pad 114 is stopped. Therefore, it is possible to suppress the irregular up-and-down movement of the wafer W during the transfer of the wafer W.

Figure 17:
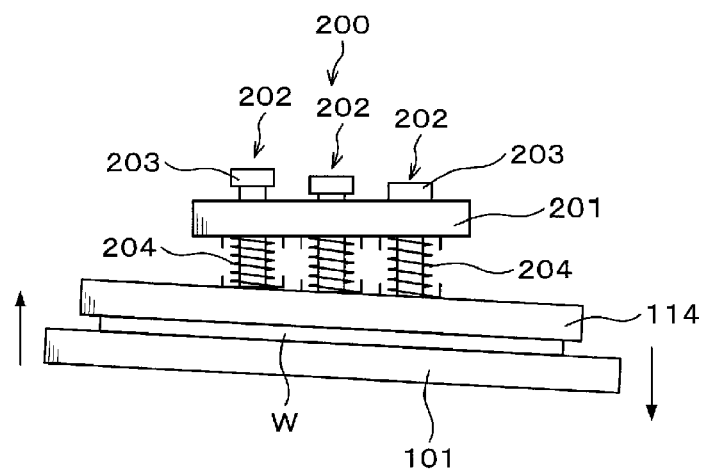
FIG. 17 is a diagram provided to explain that the transfer pad is allowed to be tilted.

Then, when the wafer W is delivered by the transfer unit 110 to the chuck 101 at the delivery position A0, the transfer pad 114 is allowed to be tilted. Therefore, for example, as illustrated in FIG. 17, even if the chuck 101 is not level (horizontal), the transfer pad 114 can be tilted according to the inclination and thus can appropriately deliver the wafer W.

Then, when the grinding processing in the processes S2 to S5 is ended and the wafer W is received by the transfer unit 110 from the chuck 101 of the delivery position A0, the transfer pad 114 is allowed to be tilted.

Then, when the wafer W is transferred by the transfer unit 110 from the delivery position A0 to the second cleaning unit 140, the tilting of the transfer pad 114 is stopped.

Then, when the non-processing surface of the wafer W held on the transfer pad 114 is cleaned in the process S6, the tilting of the transfer pad 114 is stopped. Therefore, the wafer W is not irregularly moved up and down, and, thus, the non-processing surface can be cleaned appropriately.

Figure 18:
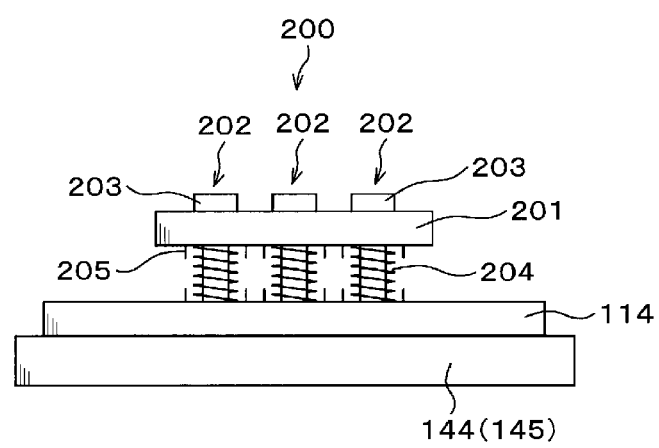
FIG. 18 is a diagram provided to explain that tilting of the transfer pad is stopped.

Before the wafer W is transferred by the transfer unit 110 in the process S6, the transfer pad 114 is cleaned using the stone cleaning tool 144 and the brush cleaning tool 145 of the second cleaning unit 140 in the process T2. When the transfer pad 114 is cleaned, the tilting of the transfer pad 114 is stopped as illustrated in FIG. 18. Therefore, the transfer pad 114 is not irregularly moved up and down, and, thus, the transfer pad 114 can be cleaned appropriately.

Then, when the wafer W is transferred by the transfer unit 110 from the second cleaning unit 140 to the first cleaning unit 130, the tilting of the transfer pad 114 is stopped.

Then, when the wafer W is delivered by the transfer unit 110 to the spin chuck 133 of the first cleaning unit 130, the transfer pad 114 is allowed to be tilted. Therefore, even if the spin chuck 133 is not level (horizontal), the transfer pad 114 can be tilted according to the inclination and thus can appropriately deliver the wafer W.

Then, the process S8 is performed, but it is performed without using the transfer unit 110. Therefore, a description thereof will be omitted.

According to the above-described exemplary embodiments, when the wafer W is delivered (received) using the transfer unit 110, the transfer pad 114 is allowed to be tilted. Therefore, for example, even if the chuck that delivers the wafer W is not level (horizontal), the transfer pad 114 can be tilted according to the inclination and thus can appropriately deliver the wafer W.

Meanwhile, the tilting of the transfer pad 114 is stopped when the wafer W is not delivered, for example, when the wafer W is transferred or cleaned and when the transfer pad 114 is cleaned. Therefore, the transfer or cleaning can be performed appropriately.

As such, the wafer processing can be performed appropriately by switchably tilting and stopping the tilting of the transfer pad 114.

The above-described substrate processing system 1 may have a thickness measurement device (not illustrated) as a measurement unit configured to measure the thickness of the protective tape with respect to the wafer W held on the transfer pad 114 of the transfer unit 110. As the thickness measurement device, a known measurement device, e.g., a spectroscopic interferometer may be used.

Here, the protective tape attached to the wafer W may have a non-uniformity in the thickness in the surface. Also, when the protective tape is attached to the wafer W, the tension becomes uneven. Therefore, the protective tape may have the non-uniformity in the thickness in the surface. Further, if the grinding is performed in a state where the protective tape has the non-uniformity in the thickness as described above, the grinding becomes non-uniform in the surface of the wafer W.

Therefore, for example, when the wafer W is delivered by the transfer unit 110 to the delivery position A0 after the orientation in the horizontal direction of the wafer W is adjusted by the alignment unit 120 in the process S1, the thickness measurement device measures the thickness of the protective tape with respect to the wafer W held on the transfer pad 114. Then, in the grinding of the processes S2 to S4, a method of bringing the grinding units 160, 170 and 180 (grinding whetstones 161, 171 and 181) into contact with the processing surface of the wafer W is adjusted based on the measurement result of the thickness of the protective tape. Then, the wafer W can be ground and thinned to a uniform thickness in the surface of the wafer W.

When the thickness of the protective tape is measured, the tilting of the transfer pad 114 is stopped. Thus, the thickness of the protective tape can be measured appropriately. The present exemplary embodiment can be applied to a case where the thickness of not only the protective tape but also another protective member, e.g., a coated protective agent or a support substrate attached to the surface of the wafer W (the surface on which the device is formed), is measured.

The configuration of the tilting mechanism and the fixing mechanism for the transfer pad 114 is not limited to the above-described exemplary embodiment.

Figure 19:
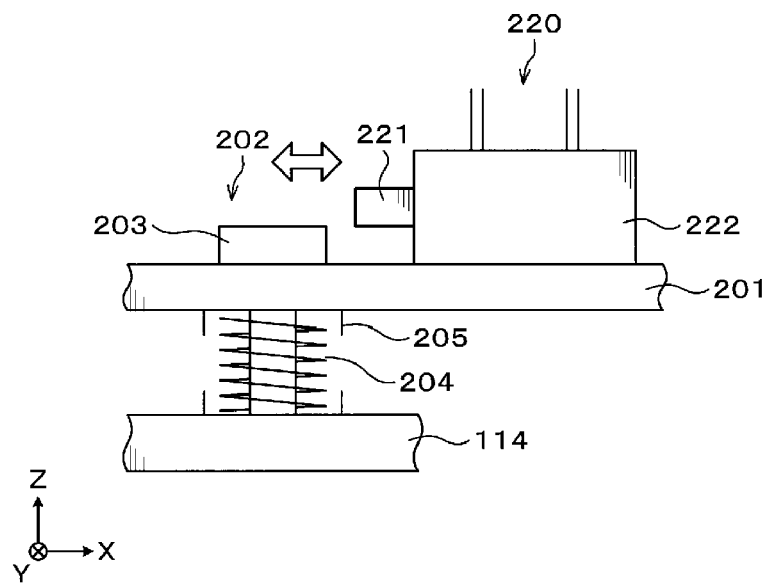
FIG. 19 is a side view schematically illustrating a configuration of a fixing mechanism for the transfer pad.

For example, as illustrated in FIG. 19, a fixing mechanism 220 includes a lock member 221 extending in the horizontal direction and a cylinder 222 configured to move the lock member 221 in the horizontal direction. With this configuration, the fixing mechanism 220 may bring the lock member 221 into contact with the bolt 203 and thus can fix the up-and-down movement of the transfer pad 114. Also, the fixing mechanism 220 may locate the lock member 221 at the side of the bolt 203 so as not to be in contact with the bolt 203 and thus can move the transfer pad 114 up and down.

Figure 20:
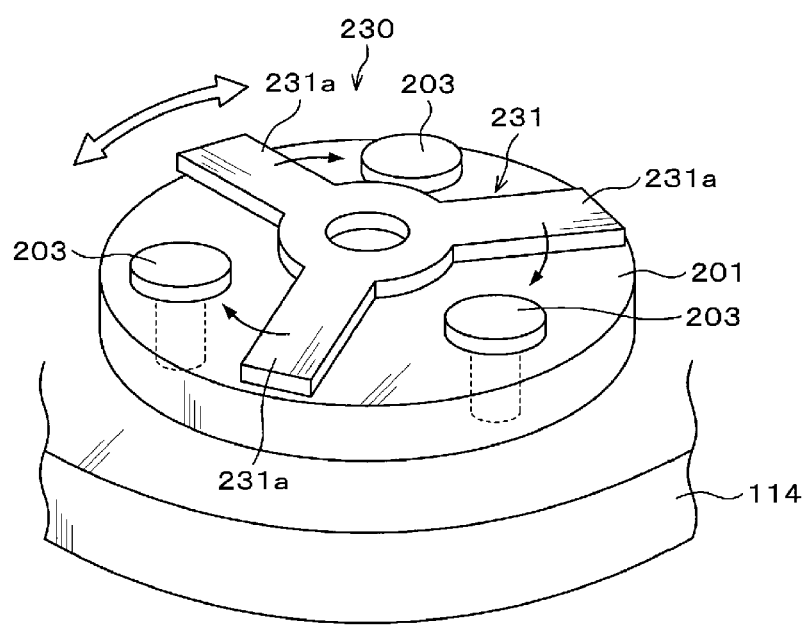
FIG. 20 is a perspective view schematically illustrating a configuration of a fixing mechanism for the transfer pad.

Further, for example, as illustrated in FIG. 20, a fixing mechanism 230 may include a rotatable lock member 231. The lock member 231 has three arms 231a extending in a diametrical direction from the center thereof, and the arms 231a are provided respectively corresponding to the bolts 203 of the tilting mechanism 200. With this configuration, the fixing mechanism 230 may bring the arms 231a into contact with the bolts 203 by rotating the lock member 231 and thus can fix the up-and-down movement of the transfer pad 114. Also, the fixing mechanism 230 may locate the arms 231a so as not to be in contact with the bolts 203 and thus can move the transfer pad 114 up and down.

Figure 21:
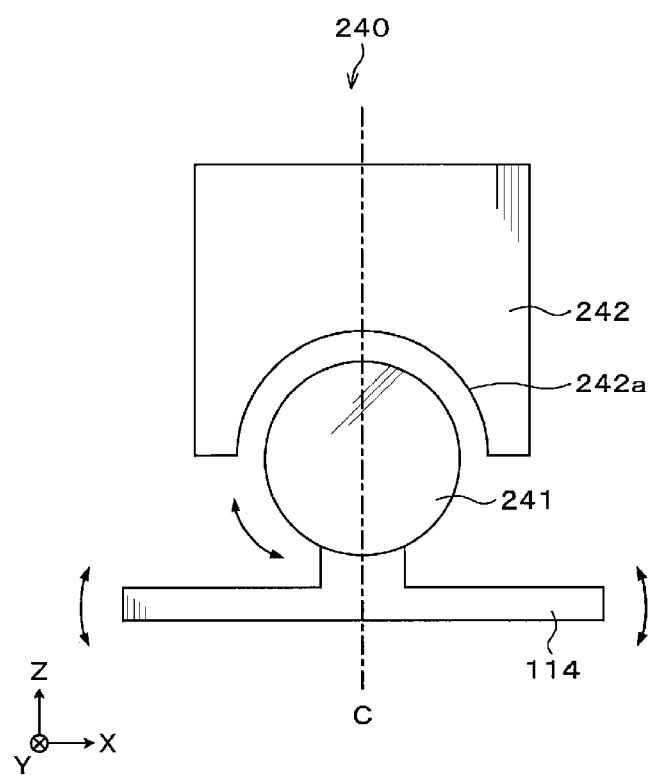
FIG. 21 is a side view schematically illustrating a configuration of a fixing mechanism for the transfer pad.

For example, as illustrated in FIG. 21, the transfer unit 110 may include a mechanism 240 (hereinafter, referred to as "combined mechanism 240") in which a tilting mechanism and a fixing mechanism are combined. The combined mechanism 240 has a support sphere 241 configured to hold the transfer pad 114 and an adsorber 242 configured to adsorb the support sphere 241 by evacuation. A curved portion 242a along the spherical shape of the support sphere 241 is formed at a bottom surface of the adsorber 242. The support sphere 241 is configured to be rotatable along the curved portion 242a. The transfer pad 114 is configured to be tilted around the central axis C in the vertical direction by the support sphere 241. Further, a plurality of suction openings (not illustrated) is formed in the curved portion 242a, and each suction opening is connected to a suction mechanism (not illustrated) that performs the evacuation.

With this configuration, in the combined mechanism 240, the curved portion 242a of the adsorber 242 attracts and holds the support sphere 241 by the evacuation. Therefore, the rotation of the support sphere 241 is stopped, and, thus, the tilting of the transfer pad 114 can be stopped. When the curved portion 242a of the adsorber 242 stops the evacuation of the support sphere 241, the support sphere 241 can rotate freely. By rotating the support sphere 241 in this manner, the transfer pad 114 can be tilted around the central axis C.

According to the above-described exemplary embodiments, the tilting mechanism 200 and the fixing mechanisms 210, 220 and 230 (combined mechanism 240) can be applied not only to the transfer pad 114 of the transfer unit 110, but also to any component that can transfer the wafer W while attracting and holding the wafer W. For example, the tilting mechanism 200 and the fixing mechanisms 210, 220 and 230 (combined mechanism 240) can also be applied to the transfer pad 34 of the wafer transfer device 32.

According to the above-described exemplary embodiments, the processing device 4 includes a single wafer transfer device, but may include two wafer transfer devices. For example, a first transfer device transfers the wafer W which has not yet been ground and transfers the wafer W between the alignment unit 120 and the delivery position A0. A second transfer device transfers the wafer W which has been ground and transfers the wafer W among the delivery position A0, the first cleaning unit 130 and the second cleaning unit 140. As such, even if two transfer devices are provided, the tilting mechanism 200 and the fixing mechanisms 210, 220 and 230 (combined mechanism 240) can be applied to each of the transfer devices.

Although the exemplary embodiments have been explained above, the present disclosure is not limited thereto. It is clear that various changes and modifications may be made by a person with ordinary skill in the art in the scope of the present disclosure defined by the following claims, and it shall be understood that all modifications and embodiments conceived from the meaning and scope of the claims and their equivalents are included in the scope of the present disclosure.

For example, according to the above-described exemplary embodiments, the protective tape is attached to the surface of the wafer W to protect the device, but a protective member of the device is not limited thereto. For example, a coated protective agent or a support substrate, such as a support wafer or a glass substrate, may be bonded to the surface of the wafer W, and even in this case, one aspect of the present disclosure can be applied.

EXPLANATION OF CODES

According to one aspect of the present disclosure, it is possible to appropriately deliver a substrate to a plurality of substrate processing devices and appropriately transfer the substrate between the plurality of substrate processing devices.

I claim:

1. A substrate processing method of processing a substrate, comprising:
    transferring the substrate to a first holder by a transfer device;
    processing a processing surface of the substrate held on the first holder by a processor;
    transferring the substrate to a cleaning device by the transfer device; and
    cleaning, by the cleaning device, a non-processing surface of the substrate which is opposite to the processing surface of the substrate held on a second holder of the transfer device or cleaning the second holder,
    wherein the transfer device includes:
    a tilting mechanism configured to perform tilting of the second holder when viewed from a side; and
    a fixing mechanism configured to stop the tilting of the second holder when viewed from the side,
    wherein when the transfer device delivers the substrate to the first holder in the transferring of the substrate to the first holder, the second holder is allowed to be tilted by the tilting mechanism, and
    in the cleaning of the non-processing surface or the cleaning of the second holder, when the non-processing surface of the substrate or the second holder is cleaned, the second holder is fixed by the fixing mechanism.

2. The substrate processing method of claim 1,
    wherein the tilting mechanism tilts the second holder around a central axis of the second holder in a vertical direction.

3. The substrate processing method of claim 1,
    wherein in each of the transferring of the substrate to the first holder and the transferring of the substrate to the cleaning device, when the substrate is transferred by the transfer device, the second holder is fixed by the fixing mechanism.

4. The substrate processing method of claim 1, further comprising:
    adjusting an orientation in a horizontal direction of the substrate by an alignment device before the transferring of the substrate to the first holder,
    wherein in the transferring of the substrate to the first holder, when the transfer device receives the substrate from the alignment device, the second holder is allowed to be tilted by the tilting mechanism.

5. The substrate processing method of claim 1, further comprising:
    transferring the substrate to a processing surface cleaning device by the transfer device after the cleaning of the non-processing surface or the cleaning of the second holder; and
    cleaning the processing surface of the substrate by the processing surface cleaning device,
    wherein in the transferring of the substrate to the processing surface cleaning device, when the transfer device delivers the substrate to the processing surface cleaning device, the second holder is allowed to be tilted by the tilting mechanism.

6. The substrate processing method of claim 1,
    wherein a semiconductor device is formed on the non-processing surface of the substrate and a protective member for protecting the semiconductor device is attached to the non-processing surface of the substrate, and
    in the transferring of the substrate to the first holder, measuring a thickness of the protective member of the substrate held on the second holder, and when measuring the thickness of the protective member, the second holder is fixed by the fixing mechanism.

7. A non-transitory computer-readable recording medium having stored thereon computer-executable instructions that, in response to execution, cause a substrate processing system to perform a substrate processing method of processing a substrate,
    wherein the substrate processing method includes:
    transferring the substrate to a first holder by a transfer device;
    processing a processing surface of the substrate held on the first holder by a processor;
    transferring the substrate to a cleaning device by the transfer device; and
    cleaning, by the cleaning device, a non-processing surface of the substrate which is opposite to the processing surface of the substrate held on a second holder of the transfer device or cleaning the second holder,
    wherein the transfer device includes:
    a tilting mechanism configured to perform tilting of the second holder when viewed from a side; and
    a fixing mechanism configured to stop the tilting of the second holder when viewed from the side,
    wherein when the transfer device delivers the substrate to the first holder in the transferring of the substrate to the first holder, the second holder is allowed to be tilted by the tilting mechanism, and
    in the cleaning of the non-processing surface or the cleaning of the second holder, when the non-processing surface of the substrate or the second holder is cleaned, the second holder is fixed by the fixing mechanism.

* * * * *